(12) United States Patent
Koini et al.

(10) Patent No.: US 12,721,167 B2
(45) Date of Patent: Aug. 25, 2026

(54) COOLING SYSTEM

(71) Applicant: TDK Electronics AG, Munich (DE)

(72) Inventors: Markus Koini, Seiersberg (AT); Markus Puff, Graz (AT); Jan Ihle, Raaba-Grambach (AT); Nele Reimer, Graz (AT)

(73) Assignee: TDK ELECTRONICS AG, Munich (DE)

( * ) Notice: Subject to any disclaimer, the term of this patent is extended or adjusted under 35 U.S.C. 154(b) by 734 days.

(21) Appl. No.: 17/635,474

(22) PCT Filed: Jul. 28, 2020

(86) PCT No.: PCT/EP2020/071245
§ 371 (c)(1),
(2) Date: Feb. 15, 2022

(87) PCT Pub. No.: WO2021/047815
PCT Pub. Date: Mar. 18, 2021

(65) Prior Publication Data

US 2022/0293490 A1 Sep. 15, 2022

(30) Foreign Application Priority Data

Sep. 12, 2019 (DE) ......................... 102019124593.1

(51) Int. Cl.
*H10W 40/47* (2026.01)

(52) U.S. Cl.
CPC .................................. *H10W 40/47* (2026.01)

(58) Field of Classification Search
CPC ... H01L 23/473; H01L 23/13; H01L 23/3735; H01L 23/481; H01L 2224/33181; H01L 23/3731; B33Y 80/00
See application file for complete search history.

(56) References Cited

U.S. PATENT DOCUMENTS 6,008,535 A 12/1999 Jean
2010/0089625 A1 4/2010 Kluge
(Continued)

FOREIGN PATENT DOCUMENTS

CN 104134638 A 11/2014
CN 108133915 A 6/2018
(Continued)

OTHER PUBLICATIONS

Machine translation of WO2018020189 (Year: 2018).*
(Continued)

*Primary Examiner* — Britt Hanley
*Assistant Examiner* — William C. Trice, III
(74) *Attorney, Agent, or Firm* — NIXON PEABODY LLP

(57) ABSTRACT

A cooling system for a semiconductor device. The system includes a first heat sink containing a ceramic material as a main component and a semiconductor device having a first contact surface. The first heat sink serves for cooling the semiconductor device and as an electrical insulator with respect to the semiconductor device. Furthermore, a first metal-containing layer is provided on at least one outer surface of the first heat sink, the first metal-containing layer having a size at least equal to the area of the first contact surface of the semiconductor device. The semiconductor device is attached to the first metal-containing layer via the contact surface by a first bonding layer formed by soldering or sintering.

16 Claims, 4 Drawing Sheets

(56) References Cited

U.S. PATENT DOCUMENTS

2010/0134979 A1* 6/2010 Obiraki ............... H01L 23/3735 361/822
2011/0272824 A1* 11/2011 Pagaila ............... H01L 23/3677 257/777
2013/0093074 A1 4/2013 Grant
2018/0254236 A1* 9/2018 Cola ...................... B82Y 30/00
2018/0366369 A1* 12/2018 Lin ................... H01L 21/76895
2020/0343150 A1* 10/2020 Marcault ............... H01L 23/051
2021/0066199 A1 3/2021 Feichtinger
2022/0293490 A1 9/2022 Koini et al.

FOREIGN PATENT DOCUMENTS

DE 19924960 A1 12/2000
DE 102008001221 A1 10/2008
DE 102016200276 A1 7/2013
DE 102014208526 A1 12/2015
DE 102018102144 A1 8/2019
EP 2565920 A1 3/2013
EP 3367426 A1 8/2018
WO WO 2018/024973 A1 2/2018
WO WO-2018020189 A2 * 2/2018 ......... H01L 21/4867
WO WO 2018/148948 A1 10/2018

OTHER PUBLICATIONS

WO2018020189A2 "Power Electronics Module for an Aircraft and Associated Production Method" Khazaka English translation (Year: 2018).*

International Search Report and Written Opinion of International Searching Authority corresponding to International Patent Application No. PCT/EP2020/071245, with English translation of International Search Report, mailed Dec. 15, 2020 (20 pages).

Vianco, P.; "A Review of Interface Microstructures in Electronic Packaging Applications: Soldering Technology"; JOM, vol. 71, No. 1, pp. 158-177; 2019; published online: Nov. 15, 2018; DOI: https://doi.org/10.1007/s11837-018-3219-z (21 pages).

Examination Report in related German Patent Application No. 11 2020 004 322.3, dated Feb. 12, 2025; in German (5 pages).

Examination Report in related Chinese Patent Application No. 202080063961.0, dated Apr. 11, 2025; in Chinese (9 pages).

Examination Report in related Chinese Patent Application No. 202080063961.0, dated Dec. 5, 2025; in Chinese (8 pages).

* cited by examiner 1a
4
1
5
3
2
2a
19

R
M
R
17
18
1
1a
17
15
15
16
16
14
18

COOLING SYSTEM

CROSS-REFERENCE TO RELATED APPLICATIONS

This application is a U.S. National Stage of International Application No. PCT/EP2020/071245, filed Jul. 28, 2020, which claims the benefit of German Patent Application No. 102019124593.1, filed Sep. 12, 2019, both of which are incorporated herein by reference in their entireties.

The invention relates to a cooling system for a semiconductor device, comprising a heat sink and a semiconductor device.

Cooling systems for semiconductor devices are essential to quickly dissipate heat generated by the semiconductor device, thereby preventing damage to the semiconductor device. Due to constantly increasing demands on semiconductor devices with respect to their performance and miniaturization, more and more efficient and compact cooling systems are also required.

It is therefore a task of the present invention to provide an improved cooling system.

The task is solved by a cooling system according to claim 1. Further embodiments of the cooling system can be found in the further claims.

A cooling system for a semiconductor device is provided, comprising a semiconductor device and a first heat sink including a ceramic material as a main component. The first heat sink is used for cooling the semiconductor device and as an electrical insulator with respect to the semiconductor device. The semiconductor device has a first contact surface through which the semiconductor device is mechanically to the first heat sink. A first metal-containing layer is applied to at least one outer surface of the first heat sink, which layer has a size corresponding at least to the area of the first contact surface of the semiconductor device, the semiconductor device being attached to the first metal-containing layer via the first contact surface by means of a first bonding layer, which is formed by soldering or sintering.

By a bonding layer shall be understood here and in the following a layer which is inevitably formed when the semiconductor device is attached to a metal-containing layer by means of soldering or sintering.

Furthermore, a cooling system for a semiconductor device is provided, which comprises the semiconductor device and the first heat sink, wherein a second metal-containing layer can additionally be applied to the first metal-containing layer and partially or completely covers the first metal-containing layer. The semiconductor device is attached to the second metal-containing layer via the first contact surface by means of the first bonding layer.

The use of ceramic materials as the main component of heat sinks has the advantage that certain ceramic materials have thermal conductivities that enable efficient dissipation of heat generated by the semiconductor device. Furthermore, the use of heat sinks containing a ceramic material as a main component has the advantage that the heat sink also acts as an electrical insulator with respect to the semiconductor device. Because of these properties of the heat sink, the entire cooling system can be designed in a compact way.

In a further embodiment of the cooling system, ceramic structures may be applied to areas of the first or the second metal-containing layer that are not covered by the semiconductor device. In this case, the ceramic structures are applied in such a way that a main surface of a second bonding layer applied to a second contact surface of the semiconductor device forms a flat surface with upper surfaces of the ceramic structures on said areas. Ceramic structures may be, for example, a plurality of ceramic films that are configured and/or arranged differently depending on the configuration of the cooling system.

Furthermore, the ceramic structures can also be created using alternative manufacturing methods, such as 3D printing methods or injection molding methods. Also, at least two different manufacturing methods may be combined to produce the ceramic structures.

Further, the ceramic structures may include, as a main component, another ceramic material having a composition different from the composition of the ceramic material included in the heat sink.

For example, an upper surface of a ceramic structure is a surface of the ceramic structure that faces a surface with which the ceramic structure is in direct contact with the first or second metal-containing layer or the first heat sink. Preferably, the upper surface is parallel or approximately, parallel to the surface with which the ceramic structure is in direct contact with the first or the second metal-containing layer or the first heat sink.

In a further embodiment of the cooling system, the outer surface of the first heat sink comprising the first metal-containing layer or the first metal-containing layer and the second metal-containing layer may be configured such that the outer surface of the first heat sink comprises a recess and the semiconductor device is arranged in the recess. In this case, a further layer comprising an electrically insulating material is applied to areas of the outer surface of the first heat sink which are not covered by the semiconductor device. The further layer is applied such that the main surface of the second bonding layer, which is app led to the second contact surface of the semiconductor device, forms a flat surface with an upper surface of the further layer on said areas.

The further layer may include, for example, polyurethane as an electrically insulating material.

By an upper surface of the further layer shall be understood here and in the following a side of the further layer which is not in direct contact with the first or second metal-containing layer or the first heat sink and which is parallel or approximately parallel to the main surface of the second bonding layer.

Preferably, the second contact surface of the semiconductor device is an outer surface of the semiconductor device that faces the first contact surface. Typically, such second contact surface is parallel or approximately parallel to the first contact surface.

By a flat surface, it is intended here and hereinafter to be understood a surface formed by the main surface of the second bonding layer and the upper surface of the further layer or upper surfaces of the ceramic structures and having no significant elevations or deepenings.

Further, a third metal-containing layer or a third metal-containing layer and a fourth metal-containing layer may be provided on the flat surface, the third metal-containing layer completely covering at least the main surface of the second bonding layer. The fourth metal-containing layer is applied to the third metal-containing layer in such a way that it partially or completely covers the latter. A second heat sink, which includes a ceramic material as a main component and is used for cooling and electrically insulating the semiconductor device, is fixed on the third metal-containing layer or the fourth metal-containing layer.

In other words, depending on the embodiment, the second heat sink is attached to either the third metal-containing layer or the fourth metal-containing layer.

Further, the first metal-containing layer or the first and fourth metal-containing layers may include a metal selected from a group comprising copper and aluminum. Preferably, the first metal-containing layer or the first and fourth metal-containing layers contain copper. Copper has the advantage of providing improved bonding of the semiconductor device to the heat sink compared to aluminum.

Furthermore, the second metal-containing layer or the second and the third metal-containing layers may contain or consist of silver. The use of silver in said layers further improves the bonding of the semiconductor device to the heat sink.

Since the metal containing layers are thin compared to the spatial extent of the heat sink, a thermal expansion coefficient of the metal-containing layers does not significantly affect the cooling system. In other words, for an optimal arrangement of the individual components of the cooling system, the thermal expansion coefficients of the semiconductor device and the ceramic heat sink are the main factors to be considered. Since the thermal expansion coefficient of the ceramic heat sink is generally similar to the thermal expansion coefficient of the semiconductor device, the mechanical stress on the cooling system caused by different thermal expansions of the individual components of the cooling system can be kept low. Thus, the overall stability of the cooling system can be increased.

Furthermore, electrical conduction paths may be integrated in the first heat sink and/or in the second heat sink and/or in the ceramic structures. These conductive paths may contain tungsten or consist of tungsten.

Further, the conductive paths may be configured to provide an electromagnetic shielding layer or a multilayer device such as a capacitor. Also, these conductive paths may have a meandered or structured design to introduce a defined power resistance into the first heat sink and/or into the second heat sink and/or into the ceramic structures.

In another embodiment of the cooling system, the cooling system may comprise a third heat sink that includes a ceramic material as a major component. The third heat sink serves to cool the semiconductor device and to act as an electrical insulator with respect to the semiconductor device. Furthermore, the third heat sink has a silicon micro-electro-mechanical systems (MEMS) structure for electrically contacting the semiconductor device. Preferably, the silicon MEMS structure is designed in such a was; that a central region of the first contact surface of the semiconductor device is in direct contact with the third heat sink and the silicon MEMS structure is in direct contact with the semiconductor device only in edge regions of the first contact surface of the semiconductor device. The electrical contact can be made by vias in the silicon MEMS structure that contain copper. The vias establish an electrical conductive contact between the first semiconductor device and a metal-containing conductive layer.

The metal-containing conductive layer is arranged under the silicon MEMS structure. In other words, the metal-containing conductive layer is arranged between the third heat sink and the silicon MEMS structure. The metal-containing conductive layer may contain any metal suitable for conducting electric current. Preferably, the metal-containing conductive layer contains copper.

By a central region of the first contact surface shall be understood here and in the following a region of the first contact surface which does not extend to an outer surface and/or outer edge of the semiconductor device in at least one spatial extension direction of the first contact surface. Preferably, the central region does not extend in any spatial extension direction of the first contact surface to an outer surface and/or outer edge of the semiconductor device.

By an edge region of the first contact surface shall be understood here and in the following a region of the first contact surface which is in direct contact with the central region and extends in at least one spatial extension direction of the first contact surface to an outer surface and/or outer edge of the semiconductor device.

Furthermore, the first heat sink and/or the second heat sink and/or the third heat sink may have a surface enlargement structure at least at a further outer surface which does not have a metal-containing layer or silicon MEMS structure. Preferably, the surface enlargement structure is formed as cooling fins. These cooling fins can be surrounded by a cooling medium. A suitable cooling medium is, for example, a mixture of ethylene glycol and water.

In one embodiment, the first heat sink and/or the second heat sink and/or the third heat sink has complex structures for surface enlargement. Such structures are, for example, fins. The design and the spacing between the fins are to be optimized in such a way that a cooling medium can flow well around the fins.

One possible embodiment of the fins described are pin-fins, i.e. fins formed in the form of thin pins, which cover the surface of the heat sink provided for this purpose in large numbers.

In order to provide such complex surface structures, conventional manufacturing processes are generally insufficient. The heat sink described can advantageously be manufactured by additive manufacturing or 3D printing.

Furthermore, the third heat sink can have microchannels through which the cooling medium flows. The microchannels in the third heat sink preferably form two cooling circuits through which the cooling medium flows in different flow directions. Since due to the microchannels structures for surface enlargement can be omitted, the cooling system can be designed very compact.

By suitable positioning of the microchannels, in one embodiment individual locations of high temperature, so-called hot spots, can be selectively cooled.

In one embodiment, the microchannels of the cooling system comprise internal structures for surface enlargement, which thus help to improve heat transfer.

The dimensions of the internal structures are matched to the internal dimensions of the microchannels.

In one embodiment, the internal structures have complex geometric shapes that are optimized with respect to the required large surface area as well as with respect to the flow rate of the cooling medium. A high flow rate helps to improve heat transfer.

If the flow rate is increased so that more cooling medium flows through the microchannels per defined period of time, a higher amount of heat can be dissipated by the cooling medium, so that the heat transfer from the heat sink to the cooling medium increases.

Furthermore, the flow rate can be optimized by suitably designed internal structures in such a way that dead spaces, i.e. spaces between the internal structures through which there is little or no flow, are avoided. The disadvantage of such dead spaces is the low heat dissipation there and thus a low cooling effect.

In a further embodiment, the heat sink comprises a single cooling channel through which cooling medium is passed. In still another embodiment, the heat sink comprises a plurality of such cooling channels.

Further, the one or more cooling channels comprise internal structures that preferably have complex geometric shapes that are optimized with respect to the surface area and the flow rate of the cooling medium.

Due to the high complexity of the internal structures, their small dimensions and the limited accessibility for machining in the cooling channels, the internal structures are advantageously manufactured by additive manufacturing or 3D printing.

The first heat sink, the second heat sink, the third heat sink, and the ceramic structures may include as a main component a ceramic material selected from a group comprising aluminum nitride, silicon nitride, and aluminum oxide.

The ceramic material used is preferably good in thermal conductivity. Furthermore, said materials have the advantage of being non-electrically conductive and therefore no additional electrical insulation layers are required between the element to be cooled and the heat sink.

A described heat sink consisting of the mentioned materials and having the described structures for surface enlargement can be easily and advantageously manufactured by additive manufacturing. In this way, a monolithic heat sink can be provided without further heat conduction resistances, as they arise when assembling a heat sink from several individual parts. Furthermore, this increases the mechanical stability of the heat sink.

A semiconductor device can be, for example, an insulated gate bipolar transistor (IGBT).

The semiconductor device can be attached to the metal-containing layers by sintering, for example silver sintering, or soldering. Furthermore, aluminum foam can also be used in the sintering process to attach the semiconductor device to the metal-containing layers. Due to the porosity of the aluminum foam, the connection is more flexible than, for example, a solder connection, making it less susceptible to mechanical stress. This further increases the stability of the cooling system.

In the following, embodiments of a cooling system are described in more detail with reference to schematic diagrams.

The figures show:

Identical, similar or apparently identical elements are marked with the same reference signs in the figures. The figures and the proportions in the figures are not to scale.

Figures 1, 2:
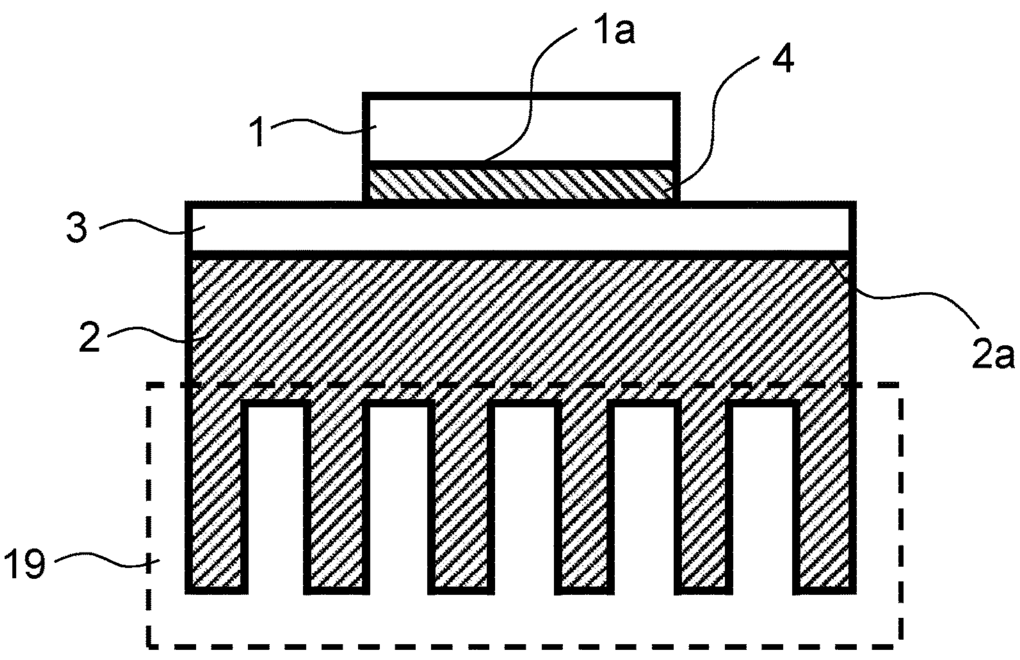
FIG. 1 shows an embodiment of a cooling system.
FIG. 2 shows a further embodiment of a cooling system.

FIG. 1 shows an embodiment of a cooling system. The cooling system comprises a first heat sink 2 which contains aluminum nitride as its main component. A metal-containing layer 3 containing copper is applied to an outer surface of the first heat sink 2*a*, the metal-containing layer 3 completely covering the outer surface of the first heat sink 2*a*. Furthermore, a semiconductor device 1 is attached to the first metal-containing layer 3 via a first contact surface 1*a* by means of a first bonding layer 4 formed by silver sintering. Another outer surface of the first heat sink, which does not have a first metal-containing layer and which faces the out surface of the first heat sink 2*a*, has a surface enlargement structure 19. The surface enlargement structure 19 is formed as cooling fins. The cooling fins are surrounded by a cooling medium based on a mixture of ethylene glycol and water (not shown).

The embodiment shown here has five layers (semiconductor device 1, first bonding layer 4, first metal-containing layer 3, first heat sink 2, and cooling medium (not shown)). This results in four heat transfers from one layer to the next. Since such a structure has fewer layers and thus fewer heat transfers than a conventional cooling system, the cooling system can be designed to be more compact than a conventional cooling system.

FIG. 2 shows a cooling system similar to that shown in FIG. 1, but the cooling system shown here also has a second metal-containing layer 5 containing silver. The second metal-containing layer 5 is applied to the first metal-containing layer 3 and covers it completely. Accordingly, the semiconductor device 1 is attached to the second metal-containing layer 5 via the first contact surface 1*a* by means of the first bonding layer 4. The second metal-containing layer 5 improves the connection of the semiconductor device 1 to the first heat sink 2.

Figure 3:
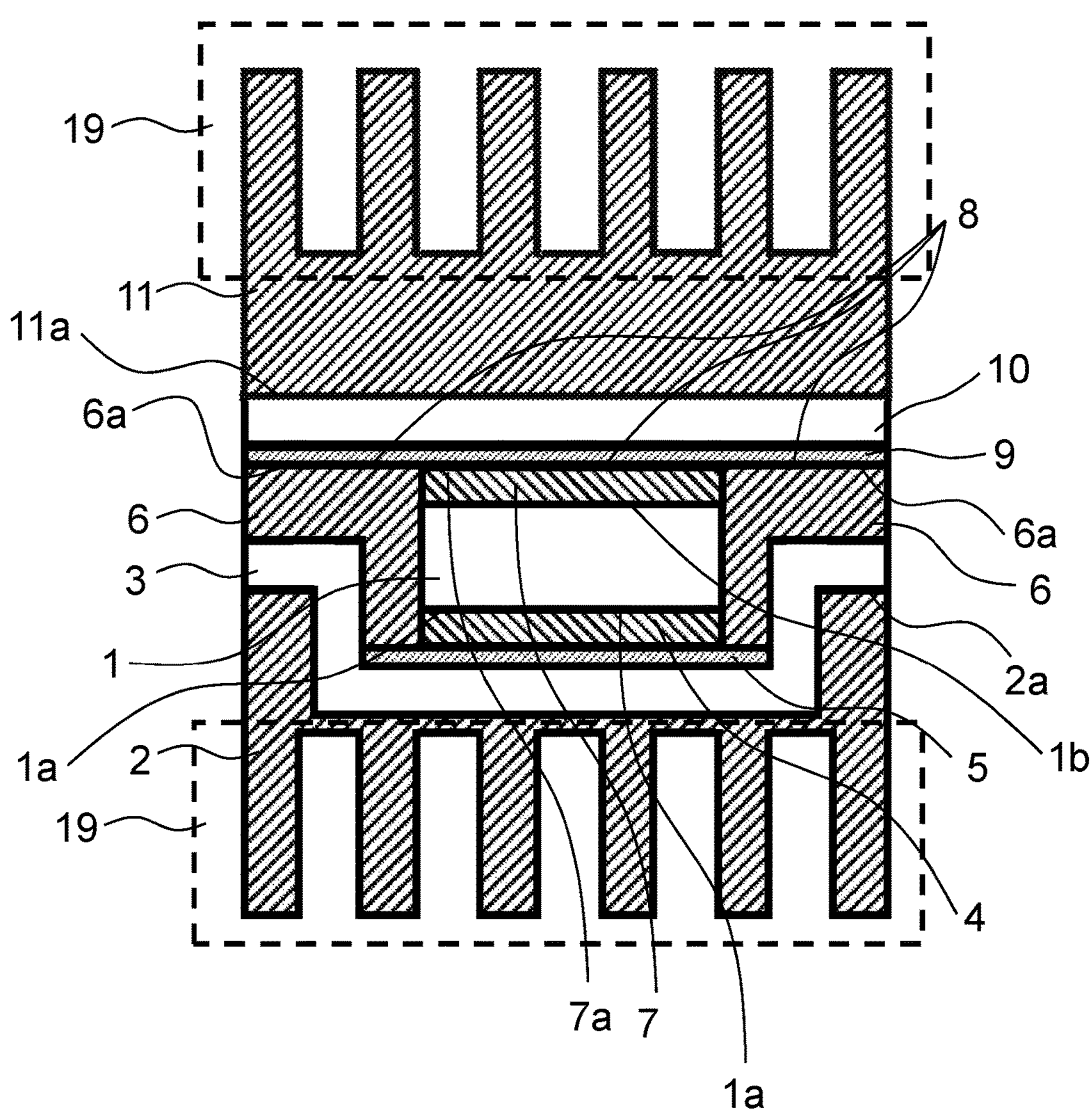
FIG. 3 shows yet another embodiment of a cooling system.

FIG. 3 shows still another embodiment of a cooling system. The cooling system comprises the first heat sink 2, in which the first metal-containing layer 3 is applied to the outer surface of the first heat sink 2*a*. Further, the outer surface of the first heat sink 2*a* has a cavity. The first metal-containing layer 3 completely covers the outer surface of the first heat sink 2*a*. Furthermore, the second metal-containing layer 5, is applied to the first metal-containing layer 3. The second metal-containing layer 5 covers the first metal-containing layer 3 only at the bottom portion of the cavity. The semiconductor device 1 is arranged in the cavity. The semiconductor device 1 is attached to the second metal-containing layer 5 via the first contact surface 1*a* by means of the first bonding layer 4. Areas of the outer surface of the first heat sink 2*a* not covered by the semiconductor device 1 are covered by a further layer 6 comprising an insulating material.

The further layer 6 comprising the insulating material is formed such that an upper surface 6*a* of the further layer 6 forms a flat surface 8 with a main surface 7*a* of a second bonding layer 7 applied to a second contact surface 1*b* of the semiconductor device 1 on said areas.

Further, a third metal-containing layer 9 containing silver is provided on the flat surface 8. A fourth metal-containing layer 10 containing copper is deposited on the third metal-containing layer 9. The semiconductor device is mechanically connected to the third metal-containing layer 9 via the second contact surface 1*b* by means of the second bonding layer 7. A second heat sink 11 which includes a ceramic material as a main component is attached to the fourth metal-containing layer 10 by means of an outer surface of the second heat sink 11*a*.

It is noted that in order to make such a cooling system, the metal-containing layers are first applied to the respective outer surfaces of the first and second heat sinks. In other words, the fourth metal-containing layer 10 is first applied to the outer surface of the second heat sink 11*a*, and then the third metal-containing layer 9 is applied to the fourth metal-containing layer 10. In a next step, the second heat sink 11 is bonded to the second bonding layer 7 and the further layer 6 via the outer surface of the second heat sink 11*a*.

Furthermore, the first heat sink 2 and the second heat sink 11 have, on further outer surfaces which do not have any metal-containing layers and are opposite the outer surfaces of the first and second heat sinks (2*a*, 11*a*), respectively, the structures for surface enlargement 19 which are designed as cooling fins.

Figure 4:
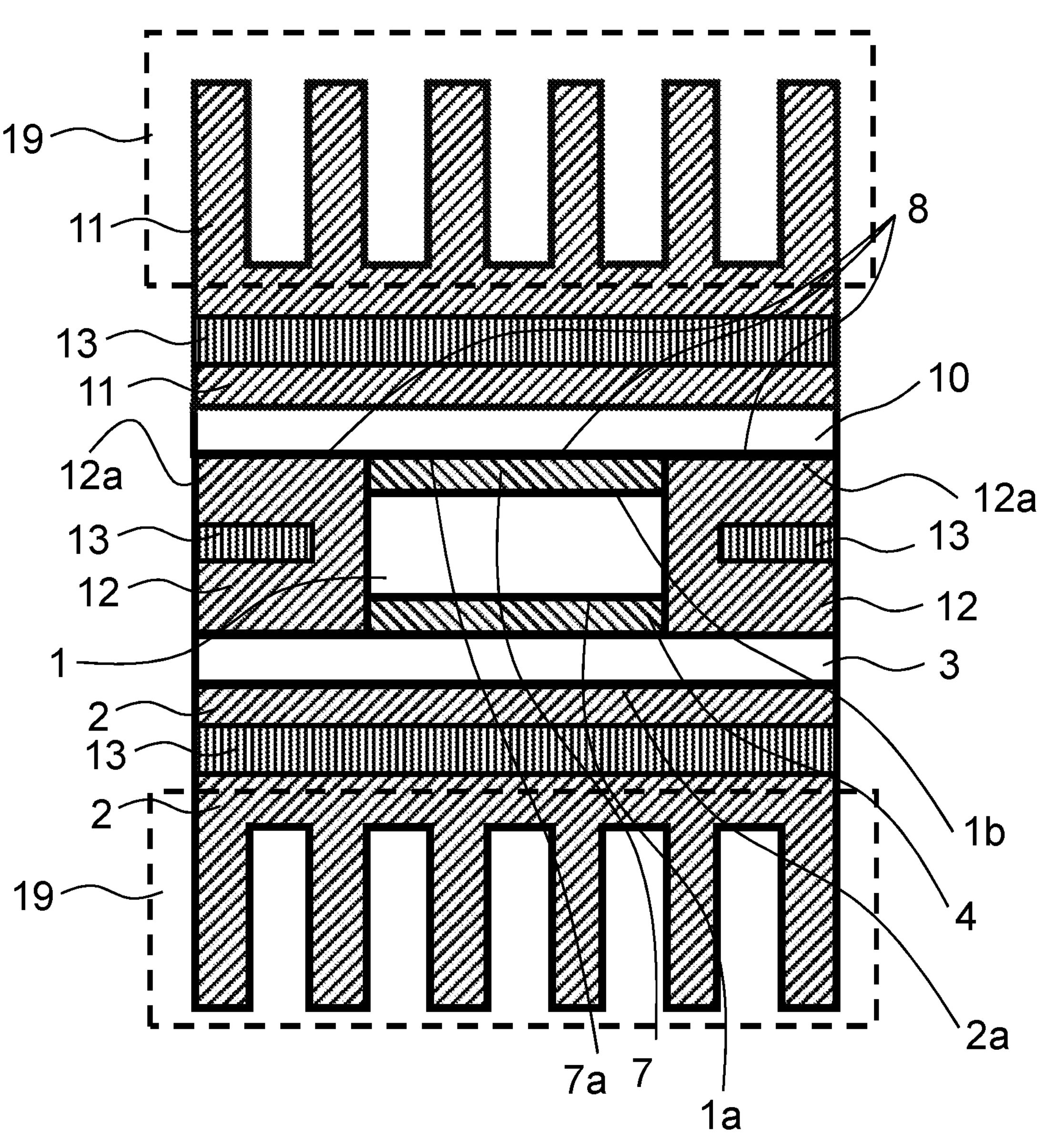
FIG. 4 shows yet another embodiment of a cooling system.

FIG. 4 shows yet another embodiment of a cooling system. The cooling system comprises the first heat sink 2, in which the first metal-containing layer 3 is applied to the outer surface of the first heat sink 2*a*. The first metal-containing layer 3 completely covers the outer surface 2*a*. The semiconductor device 1 is attached to the first metal-containing layer 3 via the first contact surface 1*a* by means of the first bonding layer 4. Ceramic structures 12 are attached to areas of the first metal-containing layer 3 that are not covered by the semiconductor device 1. The ceramic structures 12 are formed such that upper surfaces 12*a* of the ceramic structures 12 form a flat surface 8 with the main surface 7*a* of the second bonding layer 7 on said areas.

Further, the fourth metal-containing layer 10 is provided on the flat surface 8. The semiconductor device 1 is mechanically connected to the fourth metal-containing layer 10 via the second contact surface 1*b* by means of the second bonding layer 7. The second heat sink 11 is attached to the fourth metal-containing layer 10 by means of the outer surface of the second heat sink 11*a*.

Analogous to the cooling system shown in FIG. 3, the first heat sink 2 and the second heat sink 11 have the structures for surface enlargement 19.

Furthermore, conductive paths 13 containing tungsten are integrated in the first heat sink 2, the second heat sink 11 and the ceramic structures 12.

Figures 5, 6:
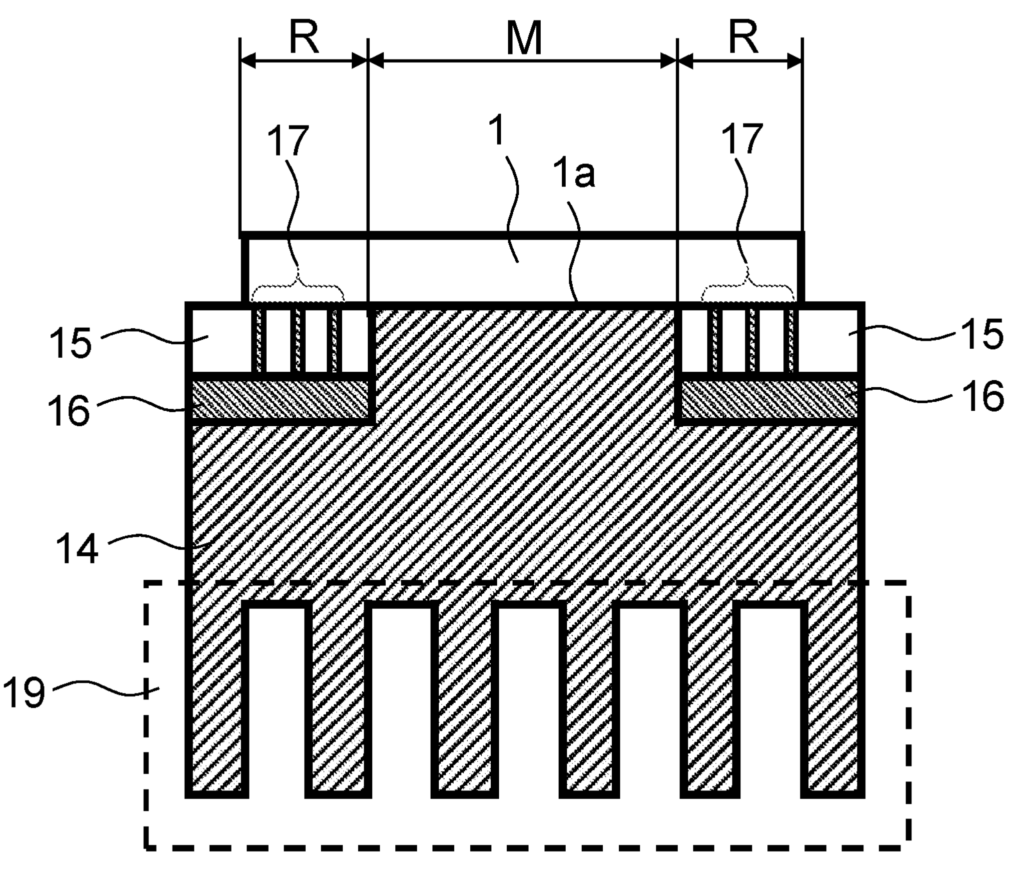
FIG. 5 shows yet another embodiment of a cooling system.
FIG. 6 shows yet another embodiment of a cooling system.

FIG. 5 shows yet another embodiment of a cooling system. The cooling system shown here comprises a third heat sink 14 which contains aluminum nitride as its main component. Furthermore, the third heat sink 14 has a silicon MEMS structure 15. The third heat sink 14 is formed such that the semiconductor device 1 is in direct contact with the third heat sink 14 with a central region M of the first contact surface 1*a*. Furthermore, the silicon MEMS structure 15 is formed such that it is in direct contact with an edge region R of the first contact surface as of the semiconductor device 1. The silicon MEMS structure has vias 17 containing copper, as a result of which the semiconductor device 1 is in electrically conductive contact with a metal-containing conductive layer 16 containing copper located under the silicon MEMS structure 15. The third heat sink 14 has the surface enlargement structures 19 on an outer surface that does not include the silicon MEMS structure 15.

In a similar embodiment, not explicitly shown, the heat sink has complex surface enlargement structures. In the present example, the structures are pin-fins that cover the designated surface of the heat sink 14 in large numbers. The distance between the individual pin-fins is to be kept as small as possible and corresponds approximately to the diameter of a pin-fin.

The heat sink described is a monolith made of an electrically non-conductive material such as a ceramic. In the present example, the heat sink 14 is made of AlN. By the described design, the heat transfer through the heat sink from the element to be cooled to the cooling medium can be optimized.

In order to provide such a monolithic heat sink with the required complex surface structures, conventional manufacturing processes are generally insufficient. The heat sink described is advantageously manufactured by additive manufacturing or 3D printing.

Furthermore, the embodiment described is similar to one of the previously described embodiments.

FIG. 6 shows yet another embodiment of a cooling system. The cooling system shown here is similar to the cooing system shown in FIG. 5. The difference is that the cooling system shown here has no cooling fins but microchannels 18 through which a cooling medium flows. The microchannels 18 form two cooling circuits through which the cooling medium flows in two different flow directions. Such a cooling system allows a very compact design of the cooling system.

Suitable positioning of the microchannels 18 enables targeted cooling of high-temperature locations (hot spots).

In another, not shown, embodiment example, the microchannels 18 of the cooling system comprise inner structures, which serve to increase the surface area and thus contribute to improving heat transfer.

The internal structures have complex geometric shapes that are optimized with respect to a large surface area and with respect to the flow rate of the cooling medium. A high flow rate contributes to the improvement of heat transfer.

Due to the increased flow rate, more cooling medium flows through the microchannels 18 per defined period of time, so that a higher amount of heat can be dissipated by the cooling medium, which increases the heat transfer from the heat sink 14 to the cooling medium.

Suitable geometric design of the internal structures can further avoid dead spaces without continuous flow of coolant.

In yet another embodiment, not shown, the heat sink 14 comprises a single cooling channel through which cooling medium is passed. In still another embodiment, the heat sink 14 comprises a plurality of such cooling channels.

The one or more cooling channels comprise internal structures that preferably have complex geometric shapes that are optimized with respect to a large surface area and with respect to the flow rate of the cooling medium.

The heat sink 14 with complex internal structures of the present embodiment is advantageously manufactured by 3D printing.

In addition, the described embodiments are similar to the embodiment in FIG. 6.

LIST OF REFERENCE SIGNS

- 1 semiconductor device
- 1*a* first contact surface of the semiconductor device
- 1*b* second contact surface of the semiconductor device
- 2 first heat sink
- 2*a* outer surface of the first heat sink on which a metal-containing layer is applied
- 3 first metal-containing layer
- 4 first bonding layer
- 5 second metal-containing layer
- 6 further layer comprising an electrically insulating material
- 6*a* upper surface of the further layer
- 7 second bonding layer
- 7*a* main surface of the second bonding layer
- 8 flat surface
- 9 third metal-containing layer
- 10 fourth metal-containing layer
- 11 second heat sink
- 11*a* outer surface of the second heat sink on which a metal-containing layer is applied
- 12 ceramic structure
- 12*a* upper surface of the ceramic structure
- 13 integrated conductive path
- 14 third heat sink

15 silicon PENS structure
16 metal-containing conductive layer
17 via
18 microchannel
19 Surface enlargement structure
M Central region of the first contact surface
R edge region of the first contact surface

The invention claimed is:

1. A cooling system for a semiconductor device comprising:

a first heat sink containing a ceramic material as a main component and an outer surface, the first heat sink serving for cooling the semiconductor device and as an electrical insulator for the semiconductor device;

a first metal-containing layer being applied to and completely covering the outer surface of the first heat sink, the first metal-containing layer having a size which equals at least to an area of a first contact surface of the semiconductor device;

a first bonding layer formed, by soldering or sintering, to fix the semiconductor device to the first metal-containing layer via the first contact surface;

a second bonding layer formed by soldering or sintering and applied to a second contact surface of the semiconductor device, the second bonding layer having a main surface;

a recess defined in the outer surface and configured in such a way that the semiconductor device is arranged therein; and a further layer having an electrically insulating material and an upper surface, the further layer being applied to areas of the outer surface, uncovered by the semiconductor device, in such a way that the main surface of the second bonding layer forms a flat surface with the upper surface of the further layer.

2. A cooling system for a semiconductor device comprising:

a first heat sink containing a ceramic material as a main component and an outer surface, the first heat sink serving for cooling the semiconductor device and as an electrical insulator for the semiconductor device;

a first metal-containing layer being applied to and completely covering the outer surface of the first heat sink, the first metal-containing layer having a size which equals at least to an area of a first contact surface of the semiconductor device;

a second metal-containing layer being applied to the first metal-containing layer and partially or completely covering the first metal-containing layer;

a first bonding layer formed, by soldering or sintering, to fix the semiconductor device to the second metal-containing layer via the first contact surface;

a second bonding layer formed by soldering or sintering and applied to a second contact surface of the semiconductor device, the second bonding layer having a main surface;

a recess defined in the outer surface and configured in such a way that the semiconductor device is arranged therein, the outer surface of the first heat sink being covered by the first metal-containing layer and the second metal-containing layer; and ceramic structures each having an upper surface, the ceramic structures being applied to areas of the outer surface, uncovered by the semiconductor device, in such a way that the main surface of the second bonding layer forms a flat surface with the upper surface of each of the ceramic structures.

3. The cooling system according to claim 2, further comprising:

a third metal-containing layer, the third metal-containing layer completely covering at least the main surface of the second bonding layer; and a second heat sink having a ceramic material as a main component and serving for cooling and for electrical insulation of the semiconductor device, the second heat sink fixed to the third metal-containing layer via an outer surface of the second heat sink.

4. The cooling system according to claim 3, wherein the first metal-containing layer or the first metal-containing layer and the fourth metal-containing layer contain a metal selected from a group consisting of copper, aluminum, and any combination thereof.

5. The cooling system according to claim 3, wherein the second metal-containing layer or the second metal-containing layer and the third metal-containing layer contain silver.

6. The cooling system according to claim 3, wherein conduction paths are integrated in an area selected from a group consisting of the first heat sink, the second heat sink, the ceramic structures, and any combination thereof.

7. The cooling system according to claim 6, wherein the conduction paths contain tungsten.

8. The cooling system according to claim 1, wherein the ceramic material is selected from a group consisting of aluminum nitride, silicon nitride, aluminum oxide, and any combination thereof.

9. The cooling system according to claim 3, wherein the first heat sink and/or the second heat sink each has a surface enlargement structure at least on a further outer surface which does not have a metal-containing layer.

10. The cooling system according to claim 9, wherein the surface enlargement structure is formed as cooling fins.

11. The cooling system according to claim 9, wherein the surface enlargement structure includes complex geometric structures that are optimized with respect to a flow rate of a cooling medium.

12. The cooling system according to claim 9, wherein the first heat sink with the surface enlargement structure formed thereon is manufactured by additive manufacturing.

13. The cooling system according to claim 6, wherein the conduction paths are configured to provide an electromagnetic shielding layer.

14. The cooling system according to claim 3, further comprising:

a fourth metal-containing layer applied on the third metal-containing layer and completely covering the third metal-containing layer, the second heat sink fixed to the fourth metal-containing layer via the outer surface of the second heat sink.

15. The cooling system according to claim 1, further comprising a second metal-containing layer applied to the first metal-containing layer in the recess of the first heat sink, the first contact surface of the semiconductor device is fixed to the first metal-containing layer via the first bonding layer and the second metal-containing layer.

16. The cooling system according to claim 1, further comprising a second heat sink having a ceramic material as a main component and serving for cooling the semiconductor device, the second heat sink is fixed to the flat surface formed by the upper surface of the electrically insulating material layer and the main surface of the second bonding layer.

* * * * *